(12) United States Patent
Shin et al.

(10) Patent No.: US 12,261,002 B2
(45) Date of Patent: Mar. 25, 2025

(54) TOUCH SWITCH STRUCTURE

(71) Applicants: HYUNDAI MOTOR COMPANY, Seoul (KR); KIA CORPORATION, Seoul (KR)

(72) Inventors: Seong Hyeon Shin, Suwon-si (KR); Jung Sang You, Hwaseong-si (KR); Ju Hyun Cha, Seoul (KR); Sang Hyun Lee, Anyang-si (KR); Seon Chae Na, Yongin-si (KR); Sang Ho Kim, Incheon (KR); Byung Yong Choi, Hwaseong-si (KR); Hyeok Lee, Siheung-si (KR); Seong Kwon Go, Hwaseong-si (KR); Chong Hwan Jeon, Anyang-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 109 days.

(21) Appl. No.: 17/748,722

(22) Filed: May 19, 2022

(65) Prior Publication Data

US 2022/0384122 A1    Dec. 1, 2022

(30) Foreign Application Priority Data

May 26, 2021    (KR) .......................... 10-2021-0067747

(51) Int. Cl.
*H01H 3/12*    (2006.01)
*H01H 9/02*    (2006.01)
(Continued)

(52) U.S. Cl.
CPC ................ *H01H 3/12* (2013.01); *H01H 9/02* (2013.01); *H01H 9/161* (2013.01);
(Continued)

(58) Field of Classification Search
CPC    H01H 3/12; H01H 9/02; H01H 9/161; H01H 2003/008; H01H 2003/0293; H01H 2009/0292; H01H 9/04; H01H 9/16; H01H 2003/00; H01H 2009/16; H01H 2009/161; H01H 13/50; H01H 2219/00;
(Continued)

(56) References Cited

U.S. PATENT DOCUMENTS

| 7,106,305 B2 | 9/2006 | Rosenberg |
| 9,711,305 B2 * | 7/2017 | Dodomeki ........... H01H 25/041 |

(Continued)

FOREIGN PATENT DOCUMENTS

| JP | 2016099908 A | 5/2016 |
| KR | 20110016285 A | 2/2011 |

(Continued)

*Primary Examiner* — Anthony R Jimenez
(74) *Attorney, Agent, or Firm* — Lempia Summerfield Katz LLC

(57) ABSTRACT

A cover type touch switch structure includes: a seat housing embedded in a seat of a vehicle so as to be fastened to a seat frame; a switch housing disposed in the seat housing and including an outer surface which is coupled to the seat housing via a hook; a light-emitting unit which is disposed in the switch housing and stacked on the seat frame; and a knob unit which has a portion disposed in the switch housing and is stacked on the light-emitting unit.

13 Claims, 5 Drawing Sheets

(51) Int. Cl.
*H01H 9/16* (2006.01)
*H01H 3/00* (2006.01)
*H01H 3/02* (2006.01)

(52) U.S. Cl.
CPC ............... *H01H 2003/008* (2013.01); *H01H 2003/0293* (2013.01); *H01H 2009/0292* (2013.01)

(58) Field of Classification Search
CPC ....... H01H 2219/014; H01H 2219/036; H01H 2219/039; H01H 2219/054; H01H 2231/026; H01H 2239/006; H01H 2239/074; H02J 3/06; H02J 3/14
USPC .............................................. 200/5 R, 51.03
See application file for complete search history.

(56) References Cited

U.S. PATENT DOCUMENTS

| | | | |
|---|---|---|---|
| 10,732,676 | B2 | 8/2020 | Xu et al. |
| 11,498,422 | B2 * | 11/2022 | Jeon ................ B60K 35/00 |
| 2019/0073003 | A1 * | 3/2019 | Xu .................... G06F 1/1692 |
| 2020/0061956 | A1 * | 2/2020 | Bräysy ................ H03K 17/962 |
| 2020/0333853 | A1 | 10/2020 | Xu et al. |

FOREIGN PATENT DOCUMENTS

| | | |
|---|---|---|
| KR | 20150005171 A | 1/2015 |
| KR | 20200035295 A | 4/2020 |
| WO | 2013137547 A1 | 9/2013 |

\* cited by examiner

[ A-A section ]

[ B-B section ]

[ A-A section ]

[ A-A section ]

TOUCH SWITCH STRUCTURE

CROSS-REFERENCE TO RELATED APPLICATION

The present application claims the benefit of and priority to Korean Patent Application No. 10-2021-0067747, filed on May 26, 2021, the entire contents of which are incorporated herein by reference.

BACKGROUND

(a) Technical Field

The present disclosure relates to a cover type touch switch structure to improve user convenience and a user feedback.

(b) Background Art

Vehicles as a transportation means (e.g., cars) provide various convenience means and functions enabling users to perform more stable and comfortable driving. Therefore, the vehicles are generally provided with various convenience devices and various switches configured to operate and control the convenience devices.

As an example, a power seat mounted in a vehicle includes a switch unit for user manipulation, and active portions of the seat are moved by manipulating the switch unit. The active portions of the seat include a headrest, a cushion extension seat, and a seat bolster. These active portions of the seat may be variously moved in response to manipulation of the switch unit.

The switch unit mounted to the power seat is generally disposed at the side surface of the power seat. The switch unit may be a push switch unit that can be pushed, a rotary switch unit that can be rotated in an axial direction, or a slide switch unit. The rotary switch unit includes a pair of rotary knobs disposed in an overlapping state so as to have the same axis of rotation and a pair of switches corresponding to the respective rotary knobs. Each rotary knob is provided with a pair of knob operating protrusions disposed around the edge thereof so as to be spaced apart from each other. In the conventional rotary switch unit, when a user rotates one of the rotary knobs in a clockwise direction or in a counterclockwise direction, the left knob operating protrusion or the right knob operating protrusion of the rotary knob may operate one of the pair of switches, and the switch may generate two manipulation signals depending on the rotational direction of the rotary knob. In addition, the other rotary knob may operate the other switch depending on the rotational direction thereof, thus generating two manipulation signals.

The slide switch unit includes a plurality of slide knobs, wherein a signal is generated to move the active portion of the seat in response to sliding of the slide knobs.

In the conventional power seat switch unit, however, the number of components is large and the structure thereof is completed, whereby assembly is difficult, assembly time is long, and manufacturing costs are high.

Meanwhile, a seat walk-in switch provided as advanced specifications of a passenger seat is located at the side surface of a seat back so as to be constantly exposed. Since the switch made of an injection-molded material and a bezel made of leather are located at the side surface of the seat back, a sense of quality is deteriorated due to a sense of difference. In addition, an upper-end touch switch located at a door assembly is wrapped with transmissive thermoplastic olefin (TPO) fabric, which is different from leather texture, whereby a sense of quality is deteriorated when the touch switch is applied to the seat. Furthermore, the switch is assembled to a hard part of a periphery thereof using screws, which is not suitable for assembly between foam pads.

The above information disclosed in this Background section is provided only for enhancement of understanding of the background of the present disclosure and therefore it may contain information that does not form the prior art that is already known to a person of ordinary skill in the art.

SUMMARY

The present disclosure provides a cover type touch switch structure configured such that a proximity sensor and a touch sensor are applied to perform a haptic operation simultaneously when the function of a seat is performed.

The present disclosure also provides a cover type touch switch structure configured such that a cover unit is made of a light-transmissive material, whereby a sense of quality is improved.

The present disclosure should be clearly understood from the following description of embodiments.

In one aspect of the present disclosure, a cover type touch switch structure includes: a seat housing embedded in a seat of a vehicle so as to be fastened to a seat frame, a switch housing disposed in the seat housing, the outer surface of the switch housing being coupled to the seat housing via a hook, a light-emitting unit disposed in the switch housing, the light-emitting unit being stacked on the seat frame, and a knob unit, at least a portion of which is disposed in the switch housing, the knob unit being stacked on the light-emitting unit.

The light-emitting unit may include a haptic actuator stacked on the seat frame, a main circuit board stacked on the haptic actuator, an LED portion stacked on the main circuit board, and a holder configured to wrap outermost sides of the haptic actuator, the main circuit board, and the LED portion.

The knob unit may include a proximity sensor unit stacked on the holder, a touch sensor unit stacked on the proximity sensor unit, and a button knob configured to wrap outermost sides of the proximity sensor unit and the touch sensor unit, and the cover type touch switch structure may further include a cover unit configured to wrap an outside of the button knob.

The cover unit may be made of transmissive PU artificial leather.

The proximity sensor unit may include a proximity sensor configured to generate a sensing output signal in response to user approach and a proximity sensor controller configured to generate approach information based on the sensing output signal received from the proximity sensor.

The proximity sensor and the proximity sensor controller may be located on a single printed circuit board.

The touch sensor unit may include a touch sensor configured to generate a touch output signal in response to a user touch and a touch sensor controller configured to receive the touch output signal from the touch sensor and to generate touch information based on the touch output signal received from the touch sensor.

The touch sensor and the touch sensor controller may be located on a single flexible circuit board.

The cover type touch switch structure may further include a leaf spring fastened between the switch housing and the holder, wherein the leaf spring may be configured to transmit vibration of the haptic actuator.

The LED portion may be configured to be turned on when the approach information is within a predetermined distance.

The predetermined distance may be 80 mm to 120 mm, and the approach information may be generated in a capacitive manner The proximity sensor unit may be of a capacitive type.

When user touch is performed within a predetermined touch region in the state in which the LED portion is on, the seat may be driven in response thereto.

When there is no user touch within a predetermined time after the LED portion is turned on, the LED portion may be turned off.

When there is user touch within a predetermined time after the LED portion is turned on, the haptic actuator may vibrate.

In another aspect, a cover type touch switch control method includes determining whether there is user approach information, turning on an LED portion in the case in which there is the user approach information, determining whether there is user touch within a predetermined time after the LED portion is turned on, and driving a seat in response to the user touch.

In the determining whether there is user approach information, a determination may be made as to whether a user approaches within a distance between 80 mm and 120 mm.

In the determining whether there is user touch within a predetermined time after the LED portion is turned on, the LED portion may be turned off in the case in which there is no user touch within the predetermined time, and the color of the LED portion may be changed, port output may be performed, and a haptic actuator may vibrate in the case in which there is the user touch within the predetermined time.

Other aspects and embodiments of the present disclosure are discussed below.

BRIEF DESCRIPTION OF THE DRAWINGS

The above and other features of the present disclosure are now described in detail with reference to certain exemplary embodiments thereof illustrated in the accompanying drawings which are given hereinbelow by way of illustration only, and thus are not limitative of the present disclosure, and wherein.

Figure 1:
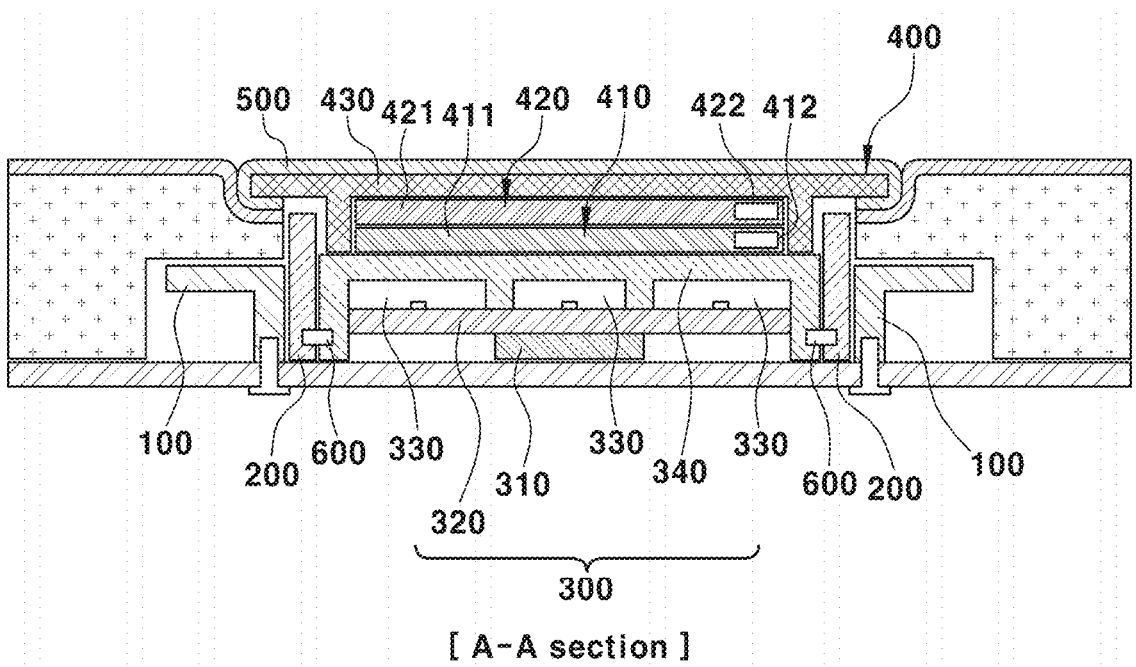
FIG. 1 is a cross-sectional view of a cover type touch switch structure according to an embodiment of the present disclosure.

It should be understood that the appended drawings are not necessarily to scale, presenting a somewhat simplified representation of various features illustrative of the basic principles of the present disclosure. The specific design features of the present disclosure as disclosed herein, including, for example, specific dimensions, orientations, locations, and shapes, would be determined in part by the particular intended application and use environment.

In the figures, reference numbers refer to the same or equivalent parts of the present disclosure throughout the several figures of the drawing.

DETAILED DESCRIPTION

Reference is now made in detail to various embodiments of the present disclosure, examples of which are illustrated in the accompanying drawings and described below. However, the present disclosure may be embodied in many different forms and should not be construed as limited to the embodiments set forth herein. The embodiments are merely given to make the disclosure of the present disclosure perfect to those having ordinary skill in the art.

The term "unit" used in this specification signifies one unit that processes at least one function or operation, and may be realized by hardware combination.

In addition, when an element is referred to as being "on" or "above" another element in this specification, it may be "directly on" the other element or an intervening element may also be present. Furthermore, when an element is referred to as being "under" or "below" another element in this specification, it may be "directly under" the other element or an intervening element may also be present.

In addition, identification symbols of steps are used for convenience of description, and the identification symbols do not describe the sequence of the steps. The steps may be performed in a sequence different from the specified sequence, unless the context clearly indicates otherwise.

When a component, device, element, or the like of the present disclosure is described as having a purpose or performing an operation, function, or the like, the component, device, or element should be considered herein as being "configured to" meet that purpose or to perform that operation or function.

FIG. 1 is a cross-sectional view of a cover type touch switch structure according to an embodiment of the present disclosure.

Referring to FIG. 1, the cover type touch switch structure according to the embodiment of the present disclosure may include a seat housing 100, a switch housing 200, a light-emitting unit 300, and a knob unit 400.

The seat housing 100 may be embedded in a seat of a vehicle so as to be fastened to a seat frame. In another form, the seat housing 100 is fastened to the seat frame by screw mounting. The seat housing 100 may define the outer surface of the lower end of the cover type touch switch structure. In seat foam of the vehicle, a recess, in which the seat housing 100 may be embedded, may be formed, whereby the seat housing 100 may be located in the recess. A screw mounting bolt may be fastened through the seat frame and the lower end of the seat housing 100.

The switch housing 200 may be disposed in the seat housing 100. A hook 210 may be formed at one end of the switch housing 200. In the state in which the switch housing 200 is completely disposed in the seat housing 100, the hook 210 may be coupled to the end of the seat housing 100. In the state in which the switch housing 200 is completely disposed in the seat housing 100, a portion of the upper end of the switch housing 200 may protrude above the upper end of the seat housing 100.

The light-emitting unit 300 may be disposed in the switch housing 200 so as to be stacked on the seat frame. The knob unit 400 may be stacked on the light-emitting unit 300. At least a portion of the knob unit 400 may be disposed in the switch housing 200.

The light-emitting unit 300 may include a haptic actuator 310, a main circuit board 320, an LED portion 330, and a holder 340. In one form, the haptic actuator 310, the main circuit board 320, and the LED portion 330 are sequentially stacked. The holder 340 may be configured to wrap the outermost sides of the haptic actuator 310, the main circuit board 320, and the LED portion 330.

The haptic actuator 310 may be stacked on the seat frame. The haptic actuator 310 may be configured to vibrate simultaneously when a function of the seat is performed. As an embodiment, the haptic actuator 310 may be configured to vibrate simultaneously when the seat is reclined such that a user recognizes that the seat is operated.

The main circuit board 320 may be stacked on the haptic actuator 310. The LED portion 330, the haptic actuator 310, and an electronic device may be disposed on the main circuit board 320 by surface mount technology (SMT). Electric wires may be provided on the main circuit board 320.

As an embodiment, the LED portion 330 and the haptic actuator 310 may be automatically inserted by equipment, which is configured to recognize marks of parts so as to automatically insert the parts, when mounted on the main circuit board 320. As another embodiment, when automatic insertion is difficult, the LED portion 330 and the haptic actuator 310 may be manually mounted on the main circuit board 320.

The LED portion 330 may be stacked on the main circuit board 320. As an embodiment, one or more LED portions 330 may be formed on the main circuit board 320 so as to be spaced apart from each other, as shown in FIG. 1. Light of the LED portion 330 may be emitted through the holder 340. The LED portion 330 may be positioned on the main circuit board 320.

The holder 340 may be made of a light blocking material. A slit configured to define the boundary when the LED portion 330 is turned on maybe formed in one surface of the holder 340. In one form, when light of the LED portion 330 is emitted upwards, a slit configured to change the position and shape of the light is formed in the holder 340.

The knob unit 400 may include a proximity sensor unit 410, a touch sensor unit 420, and a button knob 430. In another form, the proximity sensor unit 410, the touch sensor unit 420, and the button knob 430 are sequentially stacked. The cover type touch switch structure according to the embodiment of the present disclosure may further include a cover unit 500 configured to wrap the outside of the button knob 430.

The proximity sensor unit 410 may be stacked on the holder 340. The proximity sensor unit 410 may be configured to recognize a user approach signal. The touch sensor unit 420 may be stacked on the proximity sensor unit 410. The proximity sensor unit 410 may be of a capacitive type. In addition, the touch sensor unit 420 may be configured to perform capacitive type touch sensing.

The button knob 430 may be configured to wrap the outermost sides of the proximity sensor unit 410 and the touch sensor unit 420. In one form, the button knob 430 is stacked on the holder 340, and the proximity sensor unit 410 and the touch sensor unit 420 are located in the button knob 430. The outer end of the upper part of the button knob 430 may be configured to protrude more than the lower end part thereof. At least a portion of the lower end part of the button knob 430 may be disposed in the switch housing 200, and the outer end of the upper part of the button knob 430 may be located so as to be spaced apart from the upper end of the switch housing 200.

The cover unit 500 may be configured to wrap the outside of the button knob 430. In another form, the cover unit 500 is configured to wrap the outer end of the upper part of the button knob 430. The cover unit 500 may be made of transmissive polyurethane (PU) artificial leather. As an embodiment, the seat foam may be wrapped by PU or PVC, and the cover unit 500 may be made of transmissive PU artificial leather, whereby a sense of unity with the material of the seat therearound may be achieved with the naked eye.

The cover type touch switch structure according to the embodiment of the present disclosure may further include a leaf spring 600 fastened between the switch housing 200 and the holder 340. In one form, a pair of leaf springs 600 extends through the switch housing 200 and the holder 340 so as to be fixed. The leaf spring 600 may be configured to transmit vibration of the haptic actuator 310. The haptic actuator 310 may vibrate simultaneously when the function of the seat is performed, and the leaf spring 600 may transmit the vibration to the user such that the user can recognize the operation of the seat in a contact state.

Figure 2:
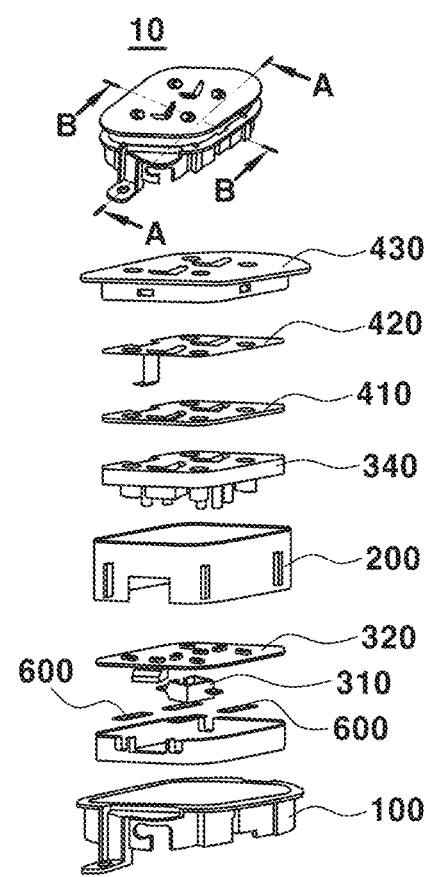
FIG. 2 is an exploded perspective view showing the cover type touch switch structure according to one embodiment of the present disclosure.

FIG. 2 is a view showing the construction of the cover type touch switch structure according to the embodiment of the present disclosure.

Referring to FIG. 2, the cover type touch switch structure according to the embodiment of the present disclosure may be configured such that the switch housing 200 is disposed in the seat housing 100 and the holder 340 and the button knob 43 are sequentially stacked in the switch housing 200.

When the LED portion 330 emits light, the light may be transmitted through predetermined regions of the holder 340, the proximity sensor unit 410, the touch sensor unit 420, and the button knob 430. In another form, the emitted light is transmitted through the predetermined regions of the holder 340, the proximity sensor unit 410, the touch sensor unit 420, and the button knob 430. Slits having the same pattern may be formed in the holder 340, the proximity sensor unit 410, the touch sensor unit 420, and the button knob 430.

The proximity sensor unit 410 may include a proximity sensor 411 and a proximity sensor controller 412. The proximity sensor 411 and the proximity sensor controller 412 may be located on a single printed circuit board. The proximity sensor 411 may generate a sensing output signal in response to user approach. In one form, when the user approaches within a predetermined distance from the cover unit 500, the proximity sensor 411 generates a sensing output signal. The proximity sensor 411 may generate a sensing output signal by recognizing a capacitance change value due to user approach.

The proximity sensor controller 412 may generate approach information based on the sensing output signal received from the proximity sensor 411. The approach information may include approach distance and approach region. The proximity sensor controller 412 may apply an approach information signal to the main circuit board 320.

The touch sensor unit 420 may include a touch sensor 421 and a touch sensor controller 422. The touch sensor 421 and the touch sensor controller 422 may be located on a single flexible circuit board. The touch sensor 421 may generate a touch output signal in response to user touch. In another form, when the user touches the cover unit 500, the touch sensor 421 generates a touch output signal. The touch sensor 421 may generate a touch output signal by recognizing a capacitance change value due to user touch. As an embodiment, the touch sensor may be configured to sense a change in pressure or electric charge due to user contact.

The touch sensor controller 422 may receive the touch output signal from the touch sensor 421. The touch sensor controller 422 may generate touch information based on the touch output signal received from the touch sensor 421. The touch information may include touch position and touch time. The touch sensor controller 422 may apply a touch information signal to the main circuit board 320.

Any of commonly available sensors may be used as the proximity sensor 411 and the touch sensor 421. Any sensor capable of measuring the distance between the user and the cover unit 500 using ultrasonic waves or heat may be used as the proximity sensor 411. Any sensor capable of sensing whether the user touches the cover unit 500 may be used as the touch sensor 421.

Figure 3:
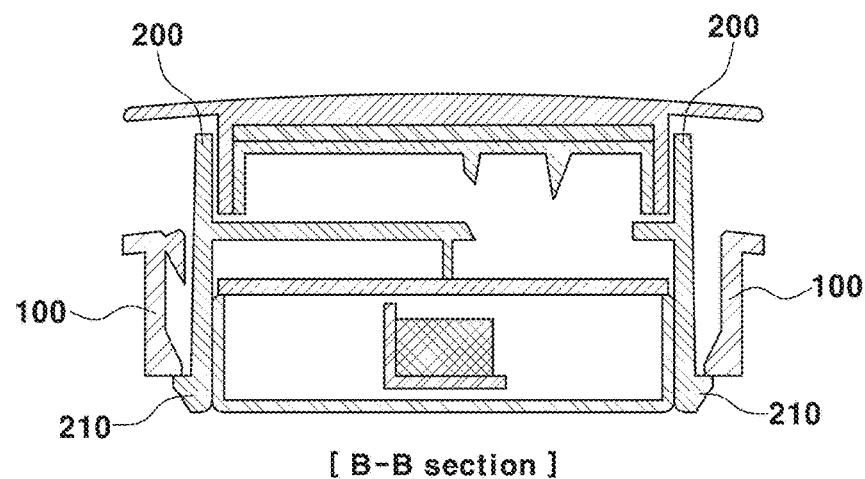
FIG. 3 is a cross-sectional view showing the state in which a seat housing and a switch housing are coupled to each other via a hook in the cover type touch switch structure according to an embodiment of the present disclosure.

FIG. 3 is a view showing the state in which the seat housing 100 and the switch housing 200 are coupled to each other via the hook in the cover type touch switch structure according to the embodiment of the present disclosure.

Referring to FIG. 3, the outer surface of the switch housing 200 may be coupled to the seat housing via the hook. In one form, the seat housing 100 is screw-mounted to the seat frame, and a seat foam pad is mounted. Subsequently, the switch housing 200 may be inserted into the seat housing 100, whereby the lower end of the seat housing 100 and the hook 210 may be coupled to each other, and therefore the switch housing 200 may be fixed. In another form, the light-emitting unit 300 and the knob unit 400 are sequentially stacked in the switch housing 200, and then the switch housing 200 is inserted into the seat housing 100.

The seat housing 100 may be embedded in the recess formed in the seat foam so as to be fixed to the seat frame. As shown in FIG. 1, the switch housing 200 may be formed so as to be higher than the seat housing 100 in the state of being disposed in the seat housing 100. The upper end of the button knob 430 may be formed so as to be spaced apart from the upper end of the switch housing 200. The button knob 430 may be formed so as to have a height corresponding to the seat foam of the surrounding portion thereof in an assembled state.

Figure 4:
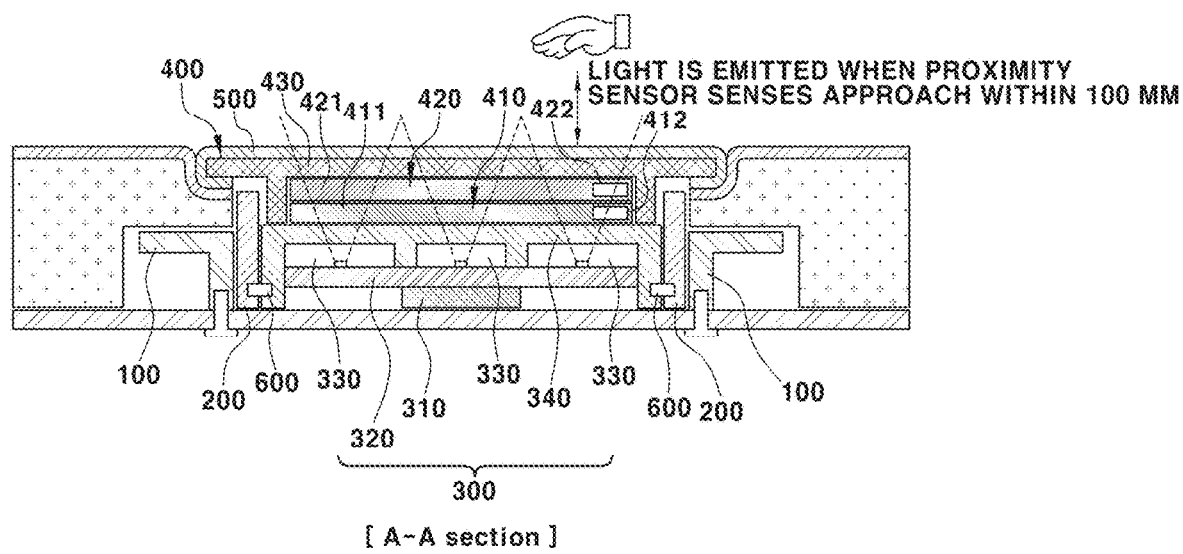
FIG. 4 is a schematic view showing the cover type touch switch structure when an LED portion is turned on according to an embodiment of the present disclosure.

FIG. 4 is a sectional view showing the case in which the LED portion 330 is turned on in the cover type touch switch structure according to the embodiment of the present disclosure.

Referring to FIG. 4, the LED portion 330 is configured to be turned on in the case in which the approach information is within a predetermined distance. When the user approaches the switch structure, the LED portion 330 may be turned on for easy recognition before touch. That is, the state in which the LED portion 330 is turned on may be set as a standby state for operating the seat.

As an embodiment, the predetermined distance may be 80 mm to 120 mm. For example, when the user approaches within 100 mm, as shown in FIG. 4, the LED portion 330 may be turned on. Approach information generated by the proximity sensor controller 412 may be generated in a capacitive manner. When the user approaches within the predetermined distance, the proximity sensor 411 may generate a sensing output signal. The proximity sensor controller 412 may generate approach information based on the sensing output signal received from the proximity sensor 411.

Figure 5:
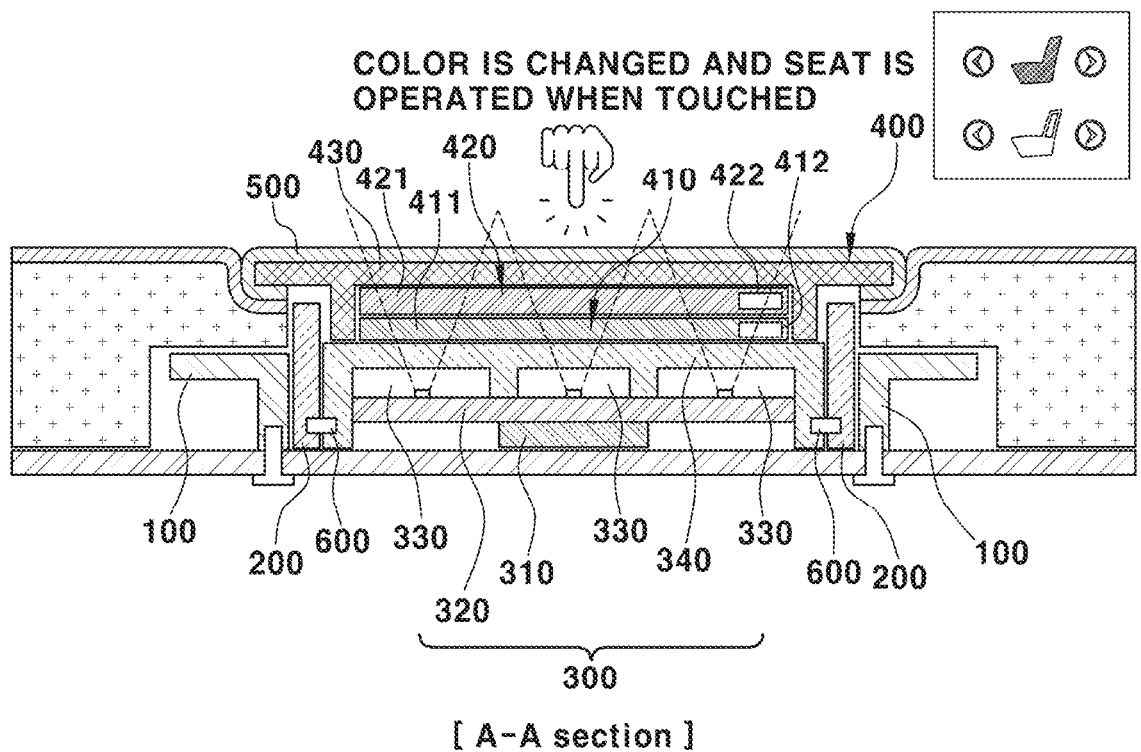
FIG. 5 is a schematic view showing the cover type touch switch structure when a user touch is performed according to an embodiment of the present disclosure.

FIG. 5 is a sectional view showing the case in which user touch is performed in the cover type touch switch structure according to the embodiment of the present disclosure.

Referring to FIG. 5, when user touch is performed within a predetermined touch region in the state in which the LED portion 330 is on, the seat may be driven in response thereto. In other words, when user touch is performed in a region other than the predetermined touch region in the state in which the LED portion 330 is on, the seat may not be driven.

Consequently, it is possible to prevent malfunction of the seat due to unintentional touch. The predetermined region may be a region that is activated in the cover unit 500 as the result of the LED portion 330 emitting light. The predetermined region may be adjusted as needed.

The cover type touch switch structure according to the present disclosure may be configured such that, when there is no user touch within a predetermined time after the LED portion 330 is turned on, the LED portion 330 is turned off. On the other hand, when there is user touch within a predetermined time after the LED portion 330 is turned on, the haptic actuator 310 may vibrate.

As an embodiment, the predetermined time after the LED portion 330 is turned on may be 5 seconds. When the LED portion 330 is turned on due to user approach and there is touch within 5 seconds, the seat may be operated and at the same time the haptic actuator 310 may vibrate. The leaf spring may transmit vibration of the haptic actuator 310 to the cover unit 500.

Meanwhile, the color of light emitted from the LED portion 330 through the cover unit 500 may be changed. As shown in FIG. 5, a function of the seat corresponding to the portion of the cover unit 500, the color of which is changed, may be performed.

Figure 6:
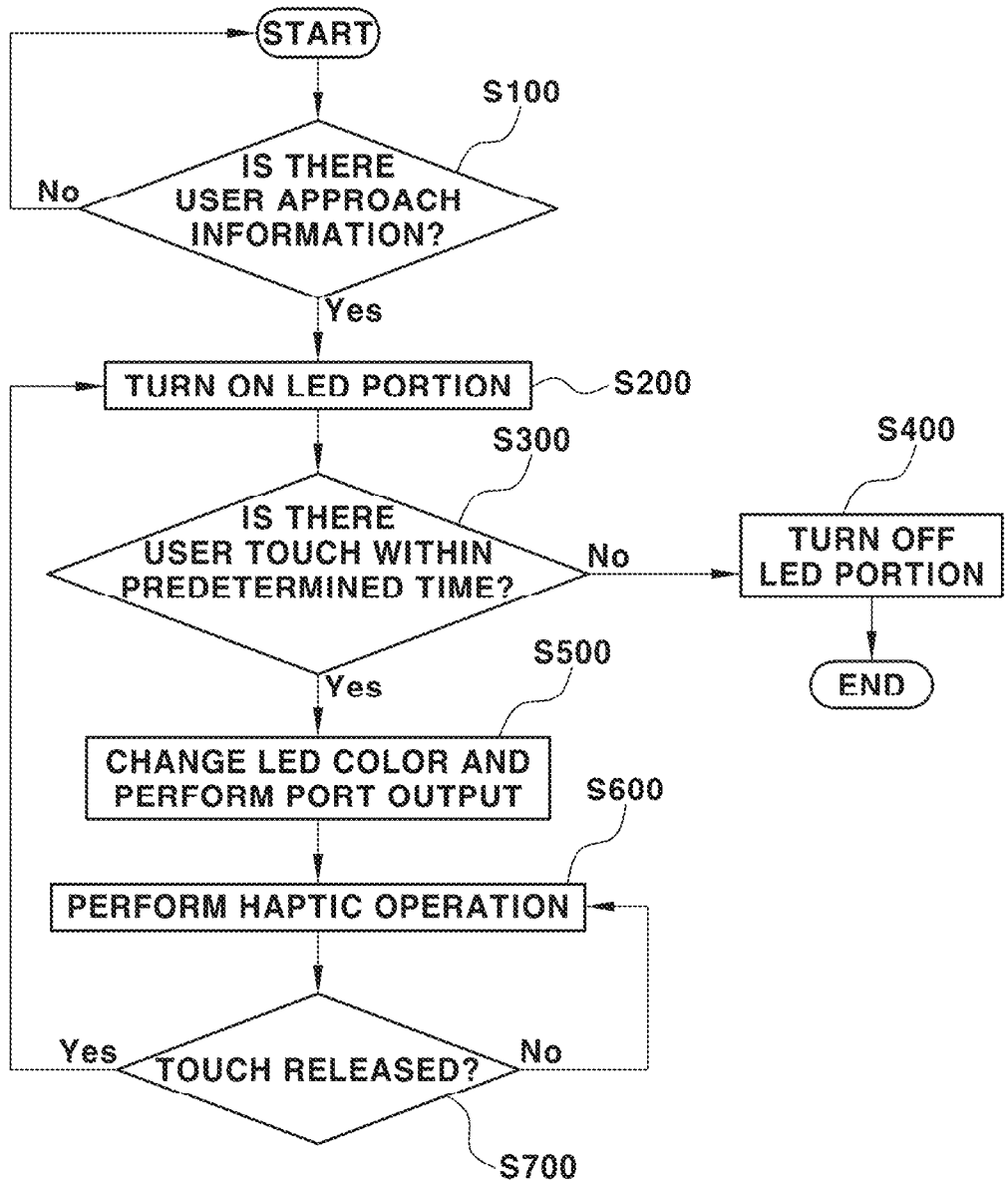
FIG. 6 is a flowchart of a control method for a cover type touch switch according to an embodiment of the present disclosure.

FIG. 6 is a flowchart of a cover type touch switch control method according to an embodiment of the present disclosure.

Referring to FIG. 6, the cover type touch switch control method according to the embodiment of the present disclosure may include a step (S100) of determining whether there is user approach information, a step (S200) of turning on the LED portion 330 in the case in which there is user approach information, a step (S300) of determining whether there is user touch within a predetermined time after the LED portion 330 is turned on, and a step of driving the seat in response to the user touch.

In the step (S100) of determining whether there is user approach information, the proximity sensor 411 may recognize a sensing output signal and may transmit the sensing output signal to the proximity sensor controller 412. Upon receiving the sensing output signal, the proximity sensor controller 412 may determine whether there is user approach information. The user approach information may be generated when the user approaches within the predetermined distance. As an embodiment, when a hand of the user approaches within a distance between 80 mm and 120 mm, the proximity sensor controller 412 may generate user approach information.

In the step (S200) of turning on the LED portion 330 in the case in which there is user approach information, as an embodiment, the logo shape formed at the cover unit 500 may be realized in the same color so as to correspond to driving of the seat. As another embodiment, the logo shape of the cover unit 500 may be realized in different colors based on functions of the seat.

In the step (S300) of determining whether there is user touch within the predetermined time after the LED portion 330 is turned on, the predetermined time may be 5 seconds as an embodiment. The touch sensor 421 may recognize whether there is user touch by capacitive sensing.

In the step (S300) of determining whether there is user touch within the predetermined time after the LED portion 330 is turned on, the LED portion 330 may be turned off when there is no user touch within the predetermined time (S400). As an embodiment, in the case in which the user does not touch the cover unit 500 within 5 seconds after the LED portion 330 is turned on as the result of user approach, the LED portion 330 may be turned off (S400).

In the step (S300) of determining whether there is user touch within the predetermined time after the LED portion 330 is turned on, the color of the LED portion 330 may be changed and port output may be performed when there is user touch within the predetermined time (S500). After the change in color of the LED portion 330 and the port output (S500), the haptic actuator 310 may vibrate (S600).

When the user touches the logo shape of the cover unit 500, the touch sensor 421 may recognize a touch output signal. The touch sensor 421 may transmit the touch output signal to the touch sensor controller 422. Upon receiving the touch output signal, the touch sensor controller 422 may determine whether there is touch information. The touch information may be generated when there is user touch within a predetermined touch region. As an embodiment, in the case in which a hand of the user touches an inner region of the cover unit 500, the touch information may be generated.

In the step of driving the seat in response to the user touch, driving of the seat corresponding to the logo shape of the cover unit touched by the user may be performed. As an embodiment, when the lower part of the logo shape shown in FIG. 5 is touched, the seat may slide. As another embodiment, when the upper part of the logo shape shown in FIG. 5 is touched, a seat back may be reclined.

In the case in which user touch on the cover unit 500 is released (S700), the LED portion 330 may be turned on. Consequently, the user may select another function of the seat in order to drive the seat.

In brief, the present disclosure provides a cover type touch switch structure configured such that the proximity sensor 411 and the touch sensor 421 are applied to improve user convenience, user feedback is enhanced through the haptic operation, and the cover unit 500 is made of a light-transmissive material, whereby a sense of quality is improved.

As is apparent from the foregoing, the present disclosure may have the following effects from the construction, combination, and use of the embodiments described above.

The proximity sensor and the touch sensor are applied to improve user convenience, and the haptic operation is performed simultaneously when the function of the seat is performed, whereby whether the seat is operated is easily recognized, and therefore it is possible to prevent malfunction.

In addition, the cover unit is made of a light-transmissive material, whereby a sense of quality is improved with no sense of difference.

The above detailed description illustrates the present disclosure. In addition, the foregoing describes exemplary embodiments of the present disclosure. The present disclosure may be used in various different combinations, changes, and environments. That is, variations or modifications can be made within the conceptual scope of the present disclosure, equivalents to the disclosure of the present disclosure, and/or the scope of technology and knowledge in the art to which the present disclosure pertains. The embodiments describe the best mode for realizing the technical concept of the present disclosure, and variations desired for the concrete application and use of the present disclosure are possible. Therefore, the above detailed description does not limit the present disclosure disclosed above. In addition, the appended claims should be interpreted to include other embodiments.

What is claimed is:

1. A touch switch structure comprising:
   a seat housing embedded in a seat of a vehicle so as to be fastened to a seat frame;
   a switch housing disposed in the seat housing, an outer surface of the switch housing being coupled to the seat housing via a hook;
   a light-emitting unit disposed in the switch housing, the light-emitting unit being stacked on the seat frame; and
   a knob unit having a portion disposed in the switch housing, the knob unit being stacked on the light-emitting unit,
   wherein the light-emitting unit comprises:
      a haptic actuator stacked on the seat frame;
      a main circuit board stacked on the haptic actuator;
      a light emitting diode (LED) portion stacked on the main circuit board; and
      a holder configured to wrap outermost sides of the haptic actuator, the main circuit board, and the LED portion,
   wherein the knob unit comprises:
      a proximity sensor unit stacked on the holder;
      a touch sensor unit stacked on the proximity sensor unit; and
      a button knob configured to wrap outermost sides of the proximity sensor unit and the touch sensor unit,
   wherein the proximity sensor unit comprises:
      a proximity sensor configured to generate a sensing output signal in response to a user approach; and
      a proximity sensor controller configured to generate approach information based on the sensing output signal received from the proximity sensor and turn on the LED portion,
   wherein, when there is no user touch, based on a touch output signal from the touch sensor unit, within a predetermined time after the LED portion is turned on, the LED portion is turned off, and
   wherein, when there is a user touch, based on the touch output signal from the touch sensor unit, within the predetermined time after the LED portion is turned on, color of the LED portion is changed, and the haptic actuator vibrates simultaneously.

2. The touch switch structure according to claim 1, wherein the proximity sensor and the proximity sensor controller are located on a single printed circuit board.

3. The touch switch structure according to claim 1, further comprising:
   a leaf spring fastened between the switch housing and the holder,
   wherein the leaf spring is configured to transmit the vibration of the haptic actuator.

4. The touch switch structure according to claim 1, wherein the proximity sensor unit is of a capacitive type.

5. The touch switch structure according to claim 1, further comprising: a cover unit configured to wrap an outside of the button knob.

6. The touch switch structure according to claim 5, wherein the cover unit is made of transmissive polyurethane (PU) artificial leather.

7. The touch switch structure according to claim 1, wherein the touch sensor unit comprises:

a touch sensor configured to generate the touch output signal in response to the user touch; and a touch sensor controller configured to receive the touch output signal from the touch sensor and to generate touch information based on the touch output signal.

8. The touch switch structure according to claim 7, wherein the touch sensor and the touch sensor controller are located on a single flexible circuit board.

9. The touch switch structure according to claim 1, wherein the LED portion is configured to be turned on when the approach information is within a predetermined distance from a cover unit configured to wrap an outside of the button knob.

10. The touch switch structure according to claim 9, wherein the predetermined distance is from 80 mm to 120 mm.

11. The touch switch structure according to claim 9, wherein, when the user touch is performed within a predetermined touch region in a state in which the LED portion is on, the seat is driven in response to the user touch.

12. A control method for a touch switch, the control method comprising:

determining whether there is user approach information based on a sensing output signal from a proximity sensor;

turning on, by a proximity sensor controller, an LED portion of the touch switch in a case in which there is the user approach information;

determining, by a touch sensor controller, whether there is a user touch based on a touch output signal from a touch sensor, within a predetermined time after the LED portion is turned on;

in response to determining that there is no user touch within the predetermined time after the LED portion is turned on, turning off the LED portion; and in response to determining that there is the user touch within the predetermined time after the LED portion is turned on, changing color of the LED portion, and performing vibration of a haptic actuator simultaneously when driving a seat in response to the user touch.

13. The control method according to claim 12, wherein in the determining whether there is the user approach information, a determination is made as to whether a user approaches within a distance between 80 mm and 120 mm from a cover unit of the touch switch.

* * * * *